(12) United States Patent
Ogawa et al.

(10) Patent No.: US 11,488,850 B2
(45) Date of Patent: *Nov. 1, 2022

(54) SUBSTRATE STORAGE CONTAINER AND GAS REPLACEMENT UNIT

(71) Applicant: Shin-Etsu Polymer Co., Ltd., Tokyo (JP)

(72) Inventors: Osamu Ogawa, Saitama (JP); Kiminori Tominaga, Itoigawa (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 742 days.

This patent is subject to a terminal disclaimer.

(21) Appl. No.: 16/471,177

(22) PCT Filed: Dec. 20, 2017

(86) PCT No.: PCT/JP2017/045724
§ 371 (c)(1),
(2) Date: Jun. 19, 2019

(87) PCT Pub. No.: WO2018/135222
PCT Pub. Date: Jul. 26, 2018

(65) Prior Publication Data
US 2019/0393062 A1 Dec. 26, 2019

(30) Foreign Application Priority Data
Jan. 18, 2017 (JP) .............................. JP2017-006998

(51) Int. Cl.
*H01L 21/673* (2006.01)
*H01L 21/67* (2006.01)

(52) U.S. Cl.
CPC .. *H01L 21/67389* (2013.01); *H01L 21/67017* (2013.01); *H01L 21/67326* (2013.01); *H01L 21/67393* (2013.01)

(58) Field of Classification Search
CPC ......... H01L 21/67389; H01L 21/67017; H01L 21/67326; H01L 21/67393;
(Continued)

(56) References Cited

U.S. PATENT DOCUMENTS

| 8,783,463 | B2* | 7/2014 | Watson | ............. | H01L 21/67393 |
|---|---|---|---|---|---|
|  |  |  |  |  | 206/454 |
| 10,101,047 | B2* | 10/2018 | Lo | ..................... | H01L 21/67393 |
| 10,923,373 | B2* | 2/2021 | Ogawa | ............. | H01L 21/67389 |

FOREIGN PATENT DOCUMENTS

| JP | 9330884 A | 12/1997 |
|---|---|---|
| JP | 2004146676 A | 5/2004 |

(Continued)

OTHER PUBLICATIONS

Office Action issued in JP2018563230 dated Sep. 13, 2022.

*Primary Examiner* — Vu A Vu
(74) *Attorney, Agent, or Firm* — The Webb Law Firm

(57) ABSTRACT

A substrate storage container and a gas replacement unit capable of reducing variations in humidity or concentration of gas in a space above a substrate are provided. The substrate storage container comprises a container body having an opening and is capable of containing substrates, a lid, at least one intake valve for supplying gas to the inside of the container body, and at least one gas replacement unit which blows out the supplied gas wherein the at least one intake valve is attached to the back, bottom surface of the container body. The gas replacement unit includes a housing member and a cover member. The housing member has a plurality of first group blowout holes in the vertical direction, and the opening area of the top first group blowout hole is larger than the opening area of the second of the first group blowout holes.

13 Claims, 13 Drawing Sheets

(58) Field of Classification Search
CPC ......... H01L 21/67379; H01L 21/67373; H01L 21/67376
USPC ....................................................... 206/711
See application file for complete search history.

(56) References Cited

FOREIGN PATENT DOCUMENTS

| | | |
|---|---|---|
| JP | 2011514014 A | 4/2011 |
| JP | 2011187884 A | 9/2011 |
| JP | 2015176976 A | 10/2015 |
| JP | 20164949 A | 1/2016 |
| JP | 2016225352 A | 12/2016 |

\* cited by examiner

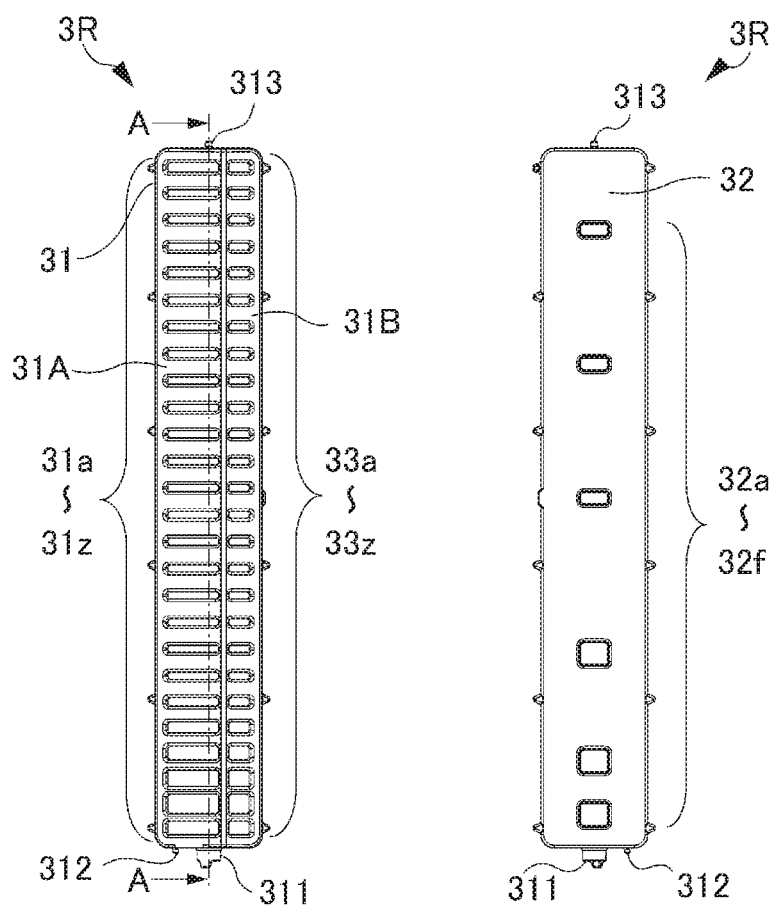
FIG. 7A
FIG. 7D
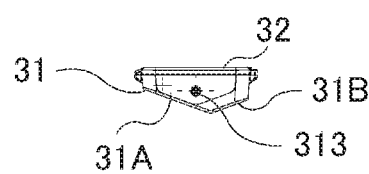
FIG. 7B
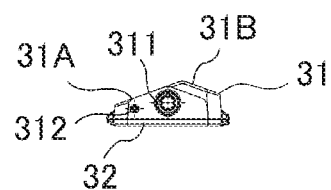
FIG. 7C

SUBSTRATE STORAGE CONTAINER AND GAS REPLACEMENT UNIT

CROSS-REFERENCE TO RELATED APPLICATIONS

This application is the United States national phase of International Application No. PCT/JP2017/045724 filed Dec. 20, 2017, and claims priority to Japanese Patent Application No. 2017-006998 filed Jan. 18, 2017, the disclosures of which are hereby incorporated by reference in their entirety.

BACKGROUND OF THE INVENTION

Field of the Invention

TECHNICAL FIELD

The present invention relates to a substrate storage container and a gas replacement unit for accommodating a plurality of substrates.

DESCRIPTION OF RELATED ART

Substrates such as semiconductor wafers are stored in the internal space of a substrate storage container which is used for storage in a warehouse, transportation between semiconductor processing devices, transportation between factories, or the like. In order to prevent oxidation or contamination of the substrates accommodated in the internal space, the internal space may be replaced with an inert gas such as nitrogen gas or dry air.

Such a substrate storage container includes a container body for storing a plurality of substrates and a lid detachably fitted on the opening of the container body, wherein intake valves for supplying a gas from outside of the container body to the internal space is fitted on the bottom of the container body, a hollow blowout nozzle communicating with an intake valve is provided upright, and blowout holes for blowing gas toward the substrate are provided on the peripheral wall of the blowout nozzle(See Patent Document 1).

The gas replacement unit described in Japanese Unexamined Patent Application 2016-004949 has a plurality of blowout holes at equal intervals in the vertical direction, and the blowout holes are all formed with the same opening area.

[Patent Document 1] Japanese Unexamined Patent Application 2016-004949

However, in the substrate storage container disclosed in Japanese Unexamined Patent Application 2016-004949, since the space formed between the substrate housed in the top row and the top surface of the container body is larger than the space formed between the substrates in other rows and the substrates in adjacent rows (for example, the top substrate and the substrate below it), the humidity or concentration of the gas in the space above a stored substrate may differ depending on the position (row) in which it is stored.

SUMMARY OF THE INVENTION

Therefore, the present invention has been made in view of the above problems, and an object of the present invention is to provide a substrate storage container and a gas replacement unit capable of reducing variations in humidity or concentration of gas in the space above the substrate.

(1) According to embodiments of the present invention, a substrate storage container comprises a container body having an opening at the front and capable of containing a plurality of substrates, a lid for closing the opening, at least one intake valve for supplying gas from outside of the container body to the internal space, and at least one gas replacement unit which blows the gas supplied from the at least one intake valve into the internal space of the container body, wherein the at least one intake valve is attached to the rear of the bottom of the container body, wherein the at least one gas replacement unit includes a housing member which stores the gas supplied from the at least one intake valve, and a cover member which covers an opening of the housing member, wherein the housing member has a plurality of first group blowout holes in the vertical direction for blowing out the stored gas in the front direction of the container body, and wherein the opening area of the uppermost first blowout hole is larger than the opening area of the first blowout hole of the second row.

(2) According to some embodiments, at least one of the first group blowout holes may be positioned lower than the lowermost level of the substrates stored in the container body.

(3) According to some embodiments, the at least one gas replacement unit may include an air permeable filter member inside the housing member and the cover member.

(4) According to some embodiments, at least one of the upper portion or the central portion of the at least one gas replacement unit may be positioned and fixed using a through hole formed in the back wall of the container body.

(5) According to some embodiments, the gas may be nitrogen gas or dry air.

(6) According to other embodiments of the present invention, a gas replacement unit for a substrate storage container having a container body having an opening on a front and capable of containing a plurality of substrates, a lid for closing the opening, and at least one intake valve for supplying gas from the outside of the container body to the internal space with the at least one intake valve attached at the rear of a bottom surface of the container body, comprises a housing member which stores the gas supplied from the at least one intake valve, and a cover member which covers the opening of the housing member, wherein the housing member has a plurality of first group blowout holes in the vertical direction for blowing out the stored gas in the front direction of the container body, and wherein the opening area of the uppermost first blowout hole is larger than the opening area of the first blowout hole of the second row.

According to the present invention, providing a substrate storage container and a gas replacement unit capable of reducing variations in the humidity or concentration of gas in the space above the substrate is possible.

BRIEF DESCRIPTION OF DRAWINGS

FIG. 7A is a front view, FIG. 7B is a plan view, FIG. 7C is a bottom view, and FIG. 7D is a rear view of the gas replacement unit.

DESCRIPTION OF THE INVENTION

Figure 1:
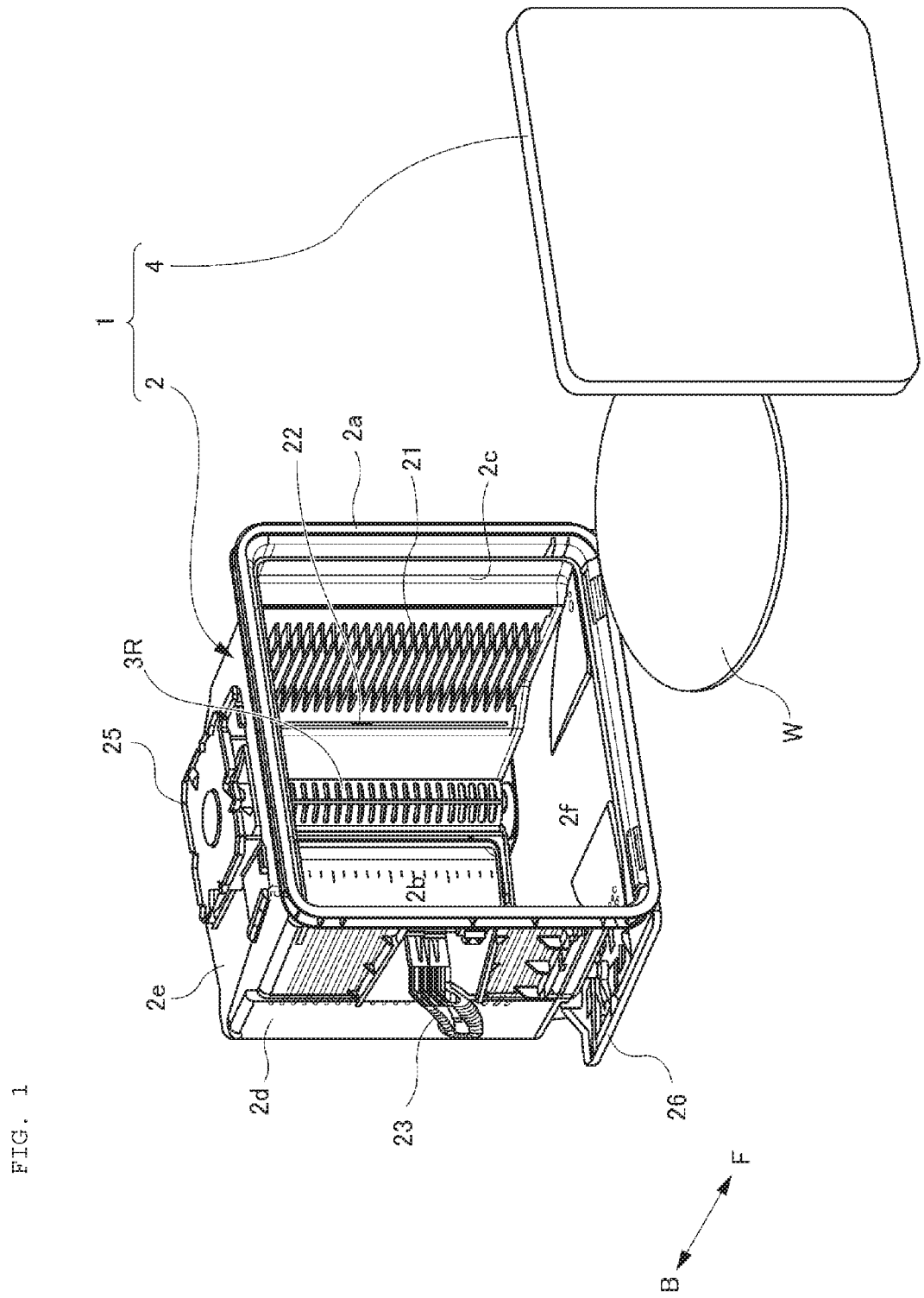
FIG. 1 is an exploded perspective view showing a substrate storage container according to an embodiment of the present invention.

Hereinafter, embodiments of the present invention will be described in detail with reference to the drawings. In the embodiments of the present specification, the same reference numerals are given to the same members throughout. In addition, in the drawings, the directions of front F and back (rear wall 2b) B are indicated by solid arrows. Moreover, the left and right refer to the state as seen from the front F.

Figure 2:
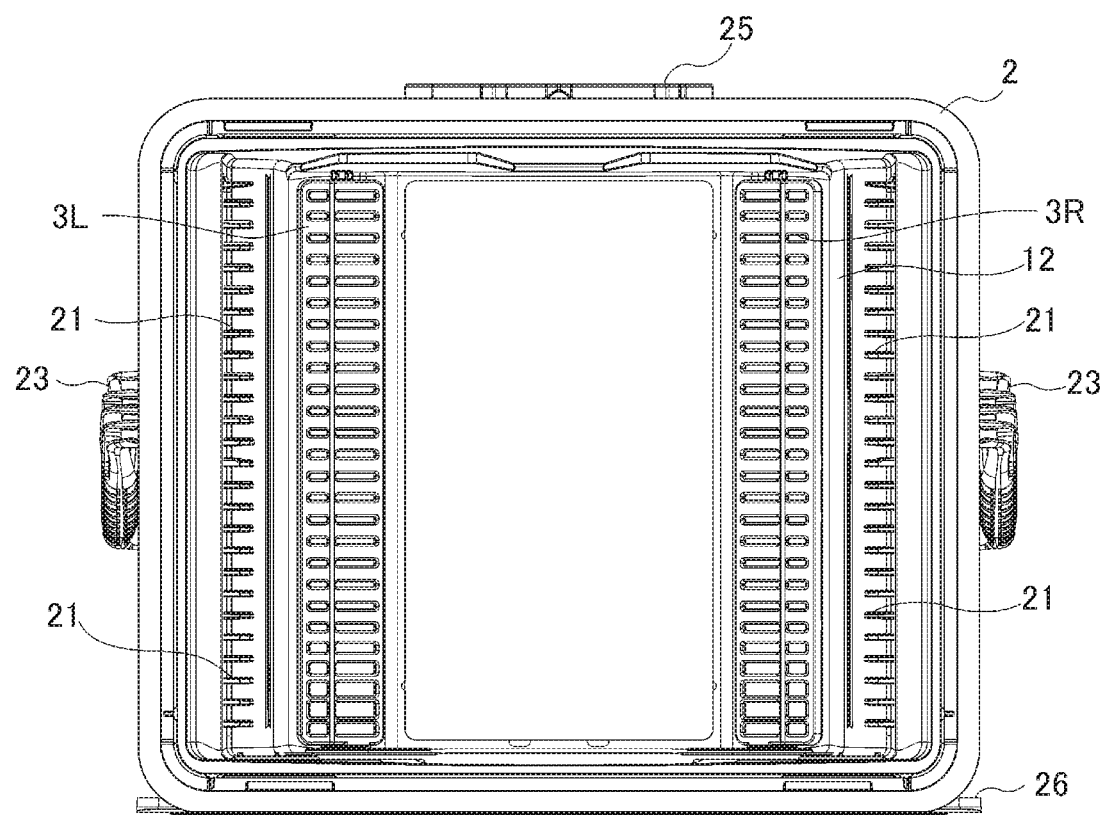
FIG. 2 is a front view of the container body.
Figure 3:
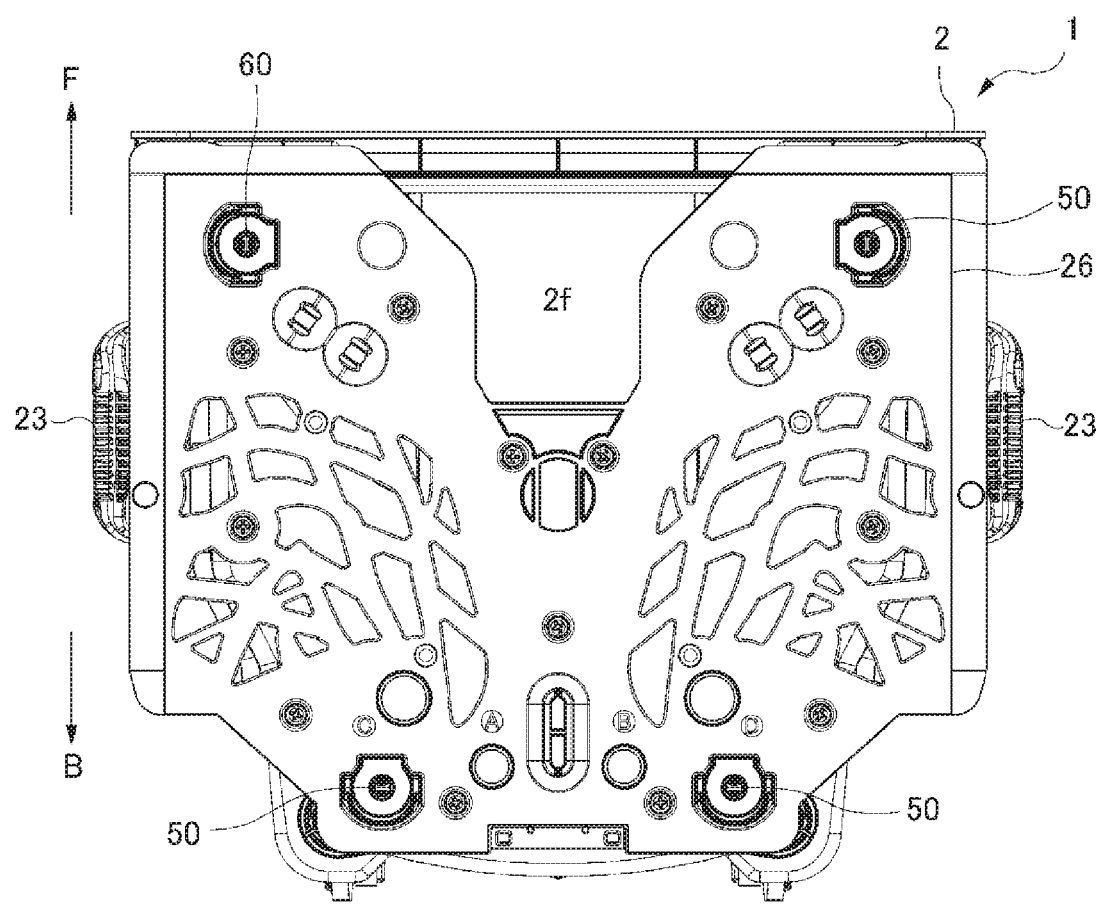
FIG. 3 is a bottom view of the container body.
Figure 4:
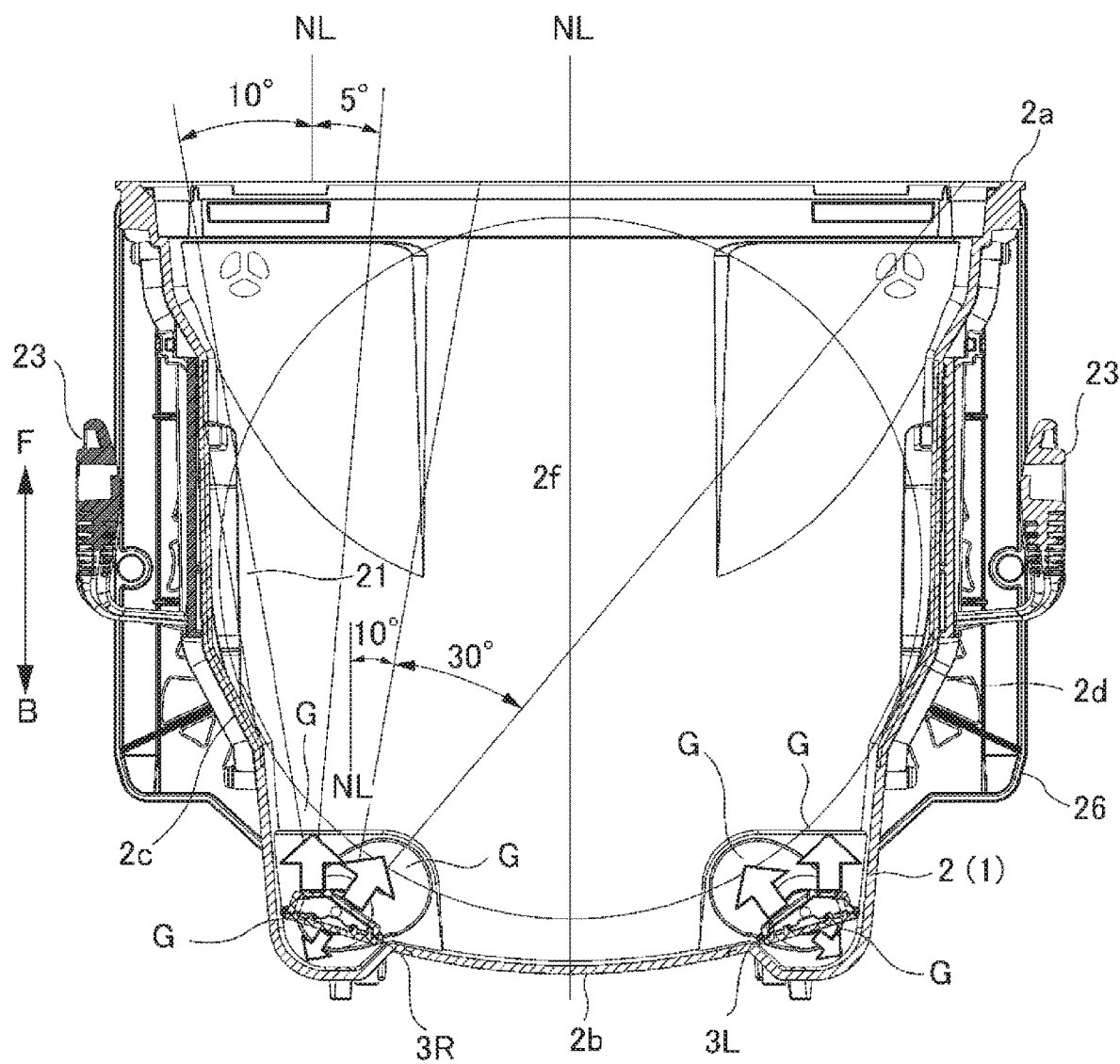
FIG. 4 is a sectional plan view of the container body.

The substrate storage container 1 will be described. FIG. 1 is an exploded perspective view of a substrate storage container according to an embodiment of the present invention. FIG. 2 is a front view of the container body; FIG. 3 is a bottom view of the container body, and FIG. 4 is a sectional plan view of the container body.

The substrate storage container 1 shown in FIG. 1 includes a container body 2 having an opening at the front F and storing a plurality of substrates W, and a lid 4 a lid 4 for closing the opening of the container body 2. Some examples of the substrates W that can be stored in the substrate storage container 1 include a semiconductor wafer having a diameter of 300 mm or 450 mm, a glass mask, or the like.

The container body 2 is a so-called front open box type formed by a front opening frame 2a, a rear wall 2b, a right side wall 2c, a left side wall 2d, a top surface 2e, and a bottom surface 2f.

Because the lid 4 is detachably attached to the opening of the front opening frame 2a of the container body 2, a sealing gasket (not shown) is attached so as to face the front opening frame 2a of the container body 2. When the lid 4 is attached to the container body 2, the sealing gasket is in close contact with the peripheral edge portion between the container body 2 and the lid 4, so as to maintain the airtightness of the internal space of the substrate storage container 1. The air in the internal space of the substrate storage container 1, whose airtightness is maintained, is replaced with a gas G via gas replacement units 3R and 3L to be described later.

On the rear wall 2b of the container body 2, protrusions projecting towards the back B are formed on both the left and right sides (see FIG. 4). These protrusions function as leg portions when placed with the opening of the front F of the container body 2 facing upward. Further, on the central outer side of the rear wall 2b of the container body 2, a scale or the like indicating the number of substrates W that can be stored is displayed (see FIG. 1).

In the area of the centers of the outside right side wall 2c and the left side wall 2d of the container body 2, grips 23 that can be used for a gripping operation are respectively attached.

A plurality of left and right pairs of support pieces 21 for horizontally supporting the stored substrates W are provided on the inside right side wall 2c and the left side wall 2d of the container body 2, and on the inner back B of the right side wall 2c and the left side wall 2d, position regulating portions 22 are provided for regulating the insertion position of the substrates W when the substrates W are inserted toward the back B.

The pairs of left and right support pieces 21 are arranged at a predetermined pitch in the vertical direction, and each support piece 21 is formed in an elongated plate shape for supporting the peripheral edges of the substrates W. In the present embodiment, the support pieces 21 and an auxiliary support pieces 21b above the uppermost support piece 21 are provided so as to be able to support 25 substrates W (see FIG. 2), but the maximum stored number of substrates W is not limited to 25. The auxiliary support pieces 21b is able to support the substrates W or a substrate equivalent.

Because the substrates W may be stored in a fully loaded state or a smaller number than the fully loaded state in the container body 2, the storage positions may be changed, as required, and the number stored and the storage state within the container body 2 depends on the usage of the substrate storage container 1. For example, a plurality of substrates W may be stored so as to be biased upward or downward or may be stored so as one is positioned in every other space.

A top flange 25 such as a robotic flange is attached to the outside of the top surface 2e of the container body 2. The top flange 25 is used for transportation between processes, such as when being gripped by an overhead conveying vehicle at a semiconductor manufacturing factory, and/or is used for positioning in a lid opening/closing device such as a semiconductor processing apparatus.

On the outside of the bottom surface 2f of the container body 2, a bottom plate 26 for positioning and placing the container body 2 is attached.

Parts such as the container body 2 and the lid 4, as well as the grip 23, the top flange 25, and the bottom plate 26 are injection-molded with a resin molding material, or a combination of a plurality of parts are injection molded. Examples of the resin contained in the molding material include thermoplastic resins such as polycarbonate, cyclic olefin polymer, polyether imide, polyether ketone, polyether ether ketone, polybutylene terephthalate, polyacetal, liquid crystal polymer, or alloys thereof.

In addition, conductive substances composed of carbon fibers, carbon powders, carbon nanotubes, conductive polymers or the like, or antistatic agents such as anions, cations, nonionic additives or the like can be added as required to these resins. Further, an ultraviolet absorber or a reinforcing fiber for improving the rigidity can be added as necessary. The container body 2, the lid 4, the grip 23, the top flange 25, the bottom plate 26, and the like may be transparent, opaque or translucent.

Figure 5:
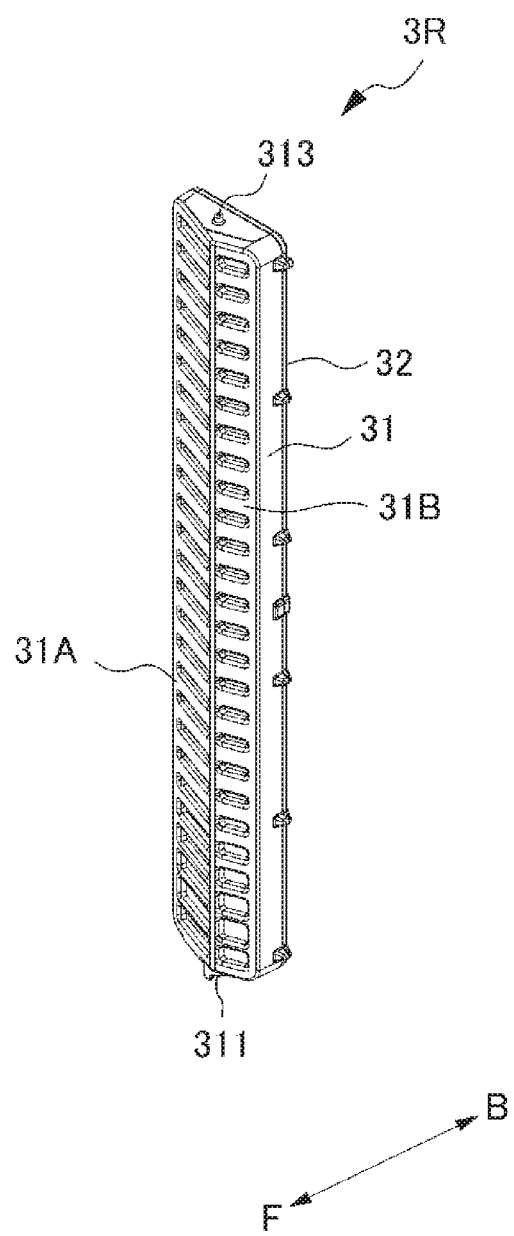
FIG. 5 is a perspective view of a gas replacement unit.
Figure 6:
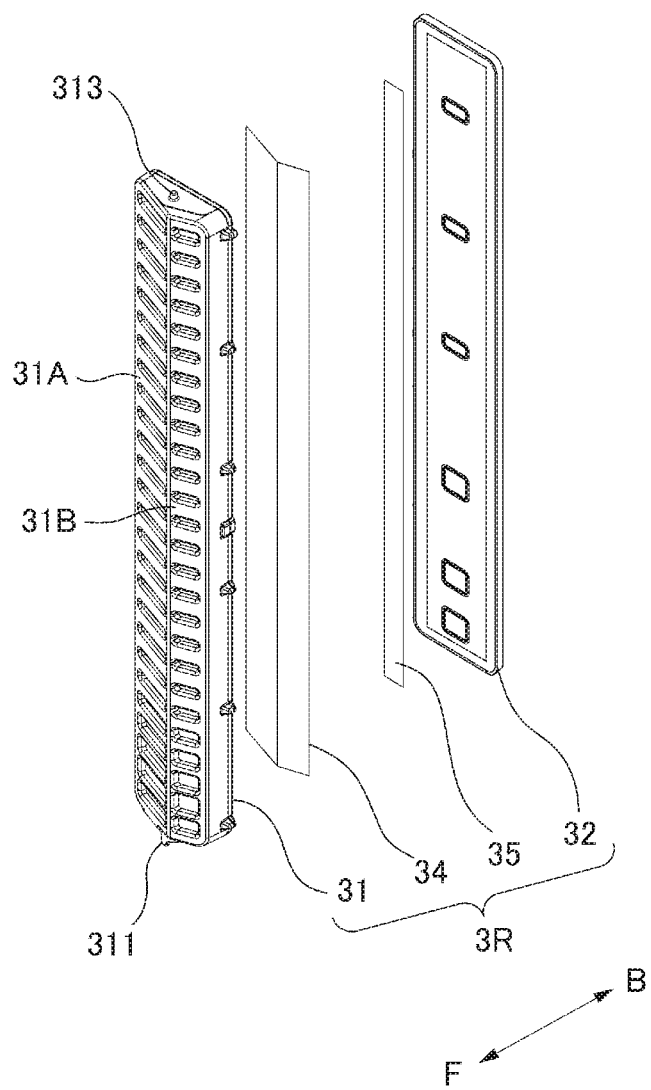
FIG. 6 is an exploded perspective view of the gas replacement unit.
Figure 8:
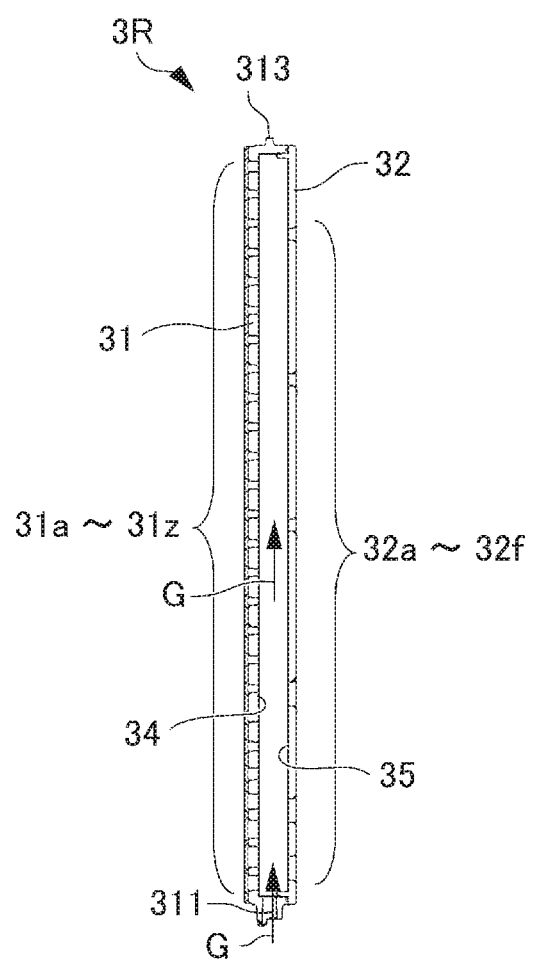
FIG. 8 is a sectional view taken along the line AA in FIG. 7A of the gas replacement unit.

Subsequently, a structure in which the internal space of the substrate storage container 1 is replaced with a gas G by the gas replacement units 3R, 3L will be described. FIG. 5 is a perspective view of the gas replacement unit 3R, and FIG. 6 is an exploded perspective view of the gas replacement unit 3R. FIG. 7A is a front view, FIG. 7B is a plan view, FIG. 7C is a bottom view, and FIG. 7D is a rear view of the gas replacement unit 3R. FIG. 8 is a cross-sectional view taken along the line AA in FIG. 7A of the gas replacement unit 3R. Moreover, FIGS. 5 to 8 show the gas replacement unit 3R on the right side as viewed from the front F.

Because the gas replacement units 3R and 3L replace the internal space of the container body 2 with a gas G, the units are provided vertically in the longitudinal direction on both the left and right sides at the back B (near the rear wall 2b or the projecting portion) of the container body 2 so as to not interfere with the substrates W even when the substrates W are inserted (See FIGS. 1 and 2).

The gas replacement units 3R and 3L blow the gas G into the internal space of the container body 2. The gas G to be blown in may be an inert gas or dry air. Further, examples of the inert gas include nitrogen gas, argon gas or the like, but from a cost perspective, nitrogen gas is preferable.

Returning to FIG. 3, on the bottom surface 2f of the container body 2, three intake valves 50 and one exhaust valve 60 are provided. The intake valves 50 and the exhaust valve 60 are configured so as to suppress the deterioration of the surface of the stored substrates W or eliminate the pressure difference between the inner space of the substrate storage container 1 and the outside by allowing the gas G to flow from outside of the substrate storage container 1 to the internal space or from the internal space outside. However, the number and arrangement of the intake valves 50 and the exhaust valves 60 are not limited to the present embodiment; the arrangement may be such that two intake valves 50 and two exhaust valves 60 are provided, or other quantities and arrangements may be used.

Of these, two intake valves 50 are provided on the left and right sides at the back B of the bottom surface 2f. The lower portions of the gas replacement units 3R and 3L are connected to these two intake valves 50 so that the gas G is able to flow. In addition, one intake valve 50 and one exhaust valve 60 are provided on the left and right sides near the front F of the bottom surface 2f.

Figure 12:
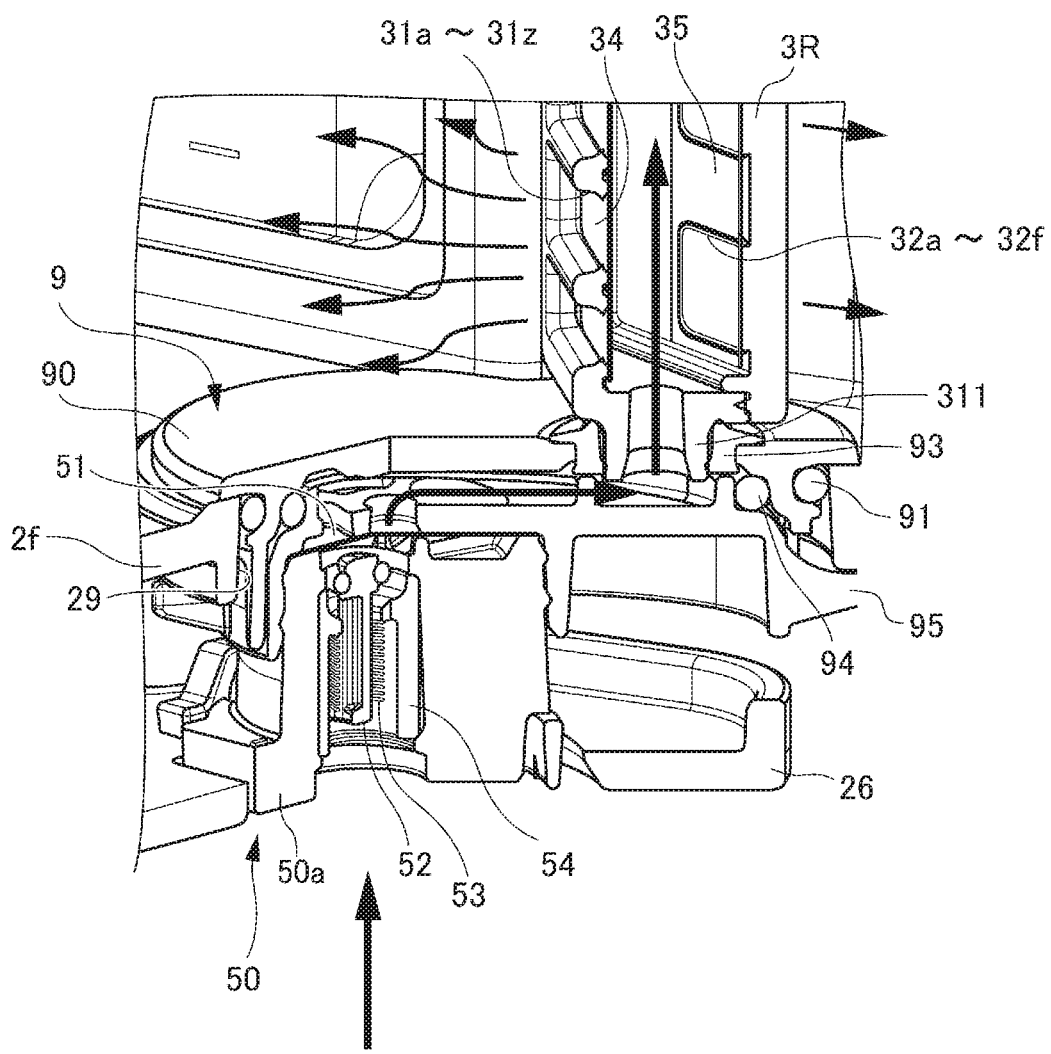
FIG. 12 is a cross-sectional perspective view showing a flow of gas flowing in from an intake valve.

Each intake valve 50 has a grommet 50a mounted in a recess formed in the bottom surface 2f of the container body 2, an air permeable filter member 51 attached to an end portion of the grommet 50a, and a check valve 52 (See FIG. 12).

The grommet 50a is formed of an elastic resin member such as an elastomer. The filter member 51 filters the supplied gas G so as to remove dust, and a nonwoven fabric filter or the like may be used. The check valve 52 is biased by the coil spring 53 in the direction of closing the valve, and is stored in the valve housing 54 (see FIG. 12).

Furthermore, the exhaust valve 60 has a check valve (not shown), and for example, by attaching a humidity (or concentration) sensor, the humidity (or concentration) of the internal space of the substrate storage container 1 after replacing the internal space of the substrate storage container 1 with the gas G is able to be measured, and managing whether the replacement of the gas G in the internal space of the substrate storage container 1 has been performed normally is also possible.

The gas replacement units 3R and 3L will be described in more detail. However, as shown in FIG. 2, because the gas replacement unit 3L has the same shape and structure, except that it is bilaterally symmetrical with the gas replacement unit 3R, its explanation will be omitted.

The gas replacement unit 3R shown in FIG. 5 includes a housing member 31 and a cover member 32 and is formed in a substantially pentagonal prism shape, but the shape is not limited thereto. Further, the gas replacement unit 3R may be formed of the same resin such as that of the container body 2, or may be formed of a different resin.

The housing member 31 is formed in a box shape in which one side is open in order to store the gas G, and the cover member 32 is attached by a locking means (engaging means) such as a hook or a welding means such as by ultrasonic waves so as to cover the open surface. A space for storing the gas G is formed by the housing member 31 and the cover member 32.

Here, the housing member 31 has two surfaces 31A, 31B of different sizes and the surfaces intersect at a predetermined angle. The intersection angle between the surface 31A and the surface 31B is in the range of 120° to 170° in the interior angle. Further, the area of the surface 31A is larger than the area of the surface 31B.

A cylindrical connecting member 311, into which the gas G from the intake valve 50 flows, protrudes from the lower surface of the housing member 31. In the vicinity of the connecting member 311, a rotation stopping protrusion 312, for positioning the rotational direction, is formed which stops the rotation of the gas replacement unit 3R in the left-right direction (See FIGS. 7A-7D). On the other hand, a cylindrical positioning protrusion 313 is formed on the upper surface of the housing member 31 for positioning and fixing to the container body 2.

As shown in FIG. 7A on the surface 31A of the housing member 31, twenty-six horizontal elongated substantially rectangular blowout holes are formed at equal intervals (for example, 10 mm pitch between the centers of the openings) as a first group of blowout holes $31a$, $31b$, $31c$ . . . $31x$, $31y$, $31z$ (hereinafter referred to as "first group blowout holes $31a$-$z$" as necessary) in the vertical direction (longitudinal direction) in order from the top. However, each height position starting from the first group blowout hole $31b$ of the second row to the first group blowout hole $31u$ need not be at equal intervals so long as they are located between the auxiliary support piece $21b$ and the lowermost support piece 21.

On the surface 31B of the housing member 31, twenty-six horizontal elongated substantially rectangular blowout holes are formed at equal intervals (for example, 10 mm pitch between the centers of the openings) as a third group of blowout holes $33a$, $33b$, $33c$ . . . $33x$, $33y$, $33z$ (hereinafter referred to as "third group blowout holes $33a$-$z$" as necessary) in the vertical direction (longitudinal direction) in order from the top. However, each height position starting from the third group blowout hole $33b$ of the second row to the third group blowout hole $33u$ need not be at equal intervals so long as they are located between the auxiliary support piece $21b$ and the lowermost support piece 21.

By forming the first group blowout holes $31a$-$z$ and third group blowout holes $33a$-$z$ on the surfaces 31A and 31B, respectively, which intersect at a predetermined angle, the gas G can be blown in differently, and the gas G easily diffuses into the internal space of the substrate storage container 1.

The opening height of the uppermost first group blowout hole $31a$ is larger than the opening height of the second first group blowout hole $31b$. That is, the opening area of first group blowout hole $31a$ is, for example, about 30% to 50% larger than the opening area of first group blowout hole $31b$, but depending on the size of the container body 2 and the blowout air volume of the gas G, the height can be increased up to about 100% (double). In the present embodiment, the opening height of the first group blowout hole $31a$ is 4 mm, and the opening height of the first group blowout hole $31b$ of the second row is 3 mm.

In addition, the opening areas starting from the first group blowout hole $31b$ to the first group blowout hole $31u$ are generally equal; moreover, each height position starting from the first group blowout hole 31b to the first group blowout hole 31u is preferably located between the auxiliary support piece 21b and the lowermost support piece 21. Then, the opening areas starting from the first group blowout hole 31v to the first group blowout hole 31y gradually become larger than the opening area of the first group blowout hole 31u, and the opening area of the first group blowout hole 31z is smaller than the opening area of the first group blowout hole 31y. Note that the same also applies to the third group blowout holes 33a-z.

Finally, the lowermost first group blowout hole 31z and third group blowout hole 33z are at least lower than the upper surface of the lowermost support piece 21, i.e. located at least below the substrates W supported by the lowermost support piece 21 of the container body 2. However, the number of holes like the first group blowout holes 31z and the third group blowout holes 33z that are below the lowermost substrate W are not limited to one but may be multiple.

For this setup, in the first group blowout holes 31a-z and the third group blowout holes 33a-z, the opening area for each of the first group blowout hole 31a and the third group blowout hole 33a in the uppermost stage is larger; thereby, even if the space formed between the uppermost substrate W and the inner surface of the top surface 2e of the container body 2 is larger than the space formed between the substrate W of the other stage and the substrate W of the adjacent stage, the air volume of the gas G blown out from the uppermost first group blowout hole 31a increases, and the humidity or concentration of the gas G in the space above the substrate W does not differ depending on the position (level) of the substrate W and is in a uniform state.

Furthermore, because the first group blowout holes 31a-z and the third group blowout holes 33a-z each have a larger opening area on the lower side, then even if the straightness of the gas G supplied from below is high, the gas G is still uniformly blown from the lower side to the upper side of the first group blowout holes 31a-z and the third group blowout holes 33a-z. Also, because the first group blowout hole 31z and the third group blowout hole 33z are also formed under the lowermost substrate W, and since the gas G is also blown out between the lowermost substrate W and the bottom surface 2f, then even if any downflow air in the clean room intrudes into the inside from the opening at the front F of the container body 2, the downflow air in the clean room does not flow more than necessary due to the gas G being blown toward the front F over the upper surface of the bottom surface 2f.

Moreover, as shown in FIG. 7D in the cover member 32, six substantially rectangular or square blowout holes are formed as a second group of blowout holes 32a, 32b . . . 32e, 32f (hereinafter referred to as "second group blowout holes 32a-f", as necessary) in the vertical direction in order from the top. The height position of the uppermost second group blowout hole 32a is substantially the same as the height position of the first group blowout hole 31c. Hereinafter, the second group blowout hole 32b and the first group blowout hole 31h coincide with each other at substantially the same height. The second group blowout hole 32c and the first group blowout hole 31m coincide with each other at substantially the same height. The second group blowout hole 32d and the first group blowout hole 31s coincide with each other at substantially the same height. The second group blowout hole 32e and the first group blowout hole 31w coincide with each other at substantially the same height.

The second group blowout hole 32f and the first group blowout hole 31y coincide with each other at substantially the same height.

Here, the ratio of the total opening area S1, S2, S3 for each of the first group blowout holes 31a-z, second group blowout holes 32a-f, and third group blowout holes 33a-z can be adjusted so that variations in humidity decreases among the plurality of substrates W stored in the container body 2. By adjusting the blowout holes of the first group blowout holes 31a-z, the second group blowout holes 32a-f, and third group blowout holes 33a-z which are provided in the housing member 31 and the cover member 32 in a different manner or by closing any appropriate blowout holes, the opening area can be adjusted.

Returning to FIG. 4, since the gas replacement units 3R, 3L are provided on the left and right sides at the back B (the rear wall 2b or the vicinity of the protrusions) of the container body 2 as described above, in order to uniformly diffuse the discharged gas G into the internal space of the substrate storage container 1, essentially, the gas is blown out from the first group blowout holes 31a-z and the third group blowout holes 33a-z toward the front F, and the air will then be replaced with gas G. At this time, since there is air also from the rear wall 2b to the right side wall 2c or the left side wall 2d behind the position where the first group blowout holes 31a-z and the third group blowout holes 33a-z are provided, the gas G is preferably blown out from the second group blowout holes 32a-f toward the back B.

The space on the front F where the first group blowout holes 31a-z and the third group blowout holes 33a-z are provided is considerably larger than the space at the back B where the first group blowout holes 31a-z and the third group blowout holes 33a-z are provided; thereby, with respect to the total opening area S1 of the first group blowout holes 31a-z and the total opening area S3 of the third group blowout holes 33a-z facing the front F, making them larger than the total opening area S2 of the second group blowout holes 32a-f facing the back B is preferable.

In addition, as described above, the gas replacement units 3R and 3L basically blow the gas G toward the front F, but are provided in the vicinity of the right side wall 2c or the left side wall 2d; thereby, the amount of gas G directed to the front F along the right side wall 2c or the left side wall 2d may be small; however, the gas G directed toward the center of the container body 2 may be larger. Therefore, making the total opening area S1 of the first group blowout holes 31a-z larger than the total opening area S3 of the third group blowout holes 33a-z is preferable.

Based on this, the ratio of the total opening area of S1, S2, and S3 for each of the first group blowout holes 31a-z, the second group blowout holes 32a-f, and the third group blowout holes 33a-z, respectively, may be S1:S2:S3=3:1:2, or the like.

Returning to FIG. 6, an air permeable filter member 34 is provided inside the housing member 31, and similarly, inside the cover member 32, an air permeable filter member 35 is also provided. Examples of the filter members 34, 35 include a nonwoven fabric filter, porous bodies, or the like.

Then, the gas G is introduced via the cylindrical connecting members 311 into the space formed by the housing member 31 and the cover member 32, and is stored. The stored gas G passes through the filter members 34, 35, and is blown out from the first group blowout holes 31a-z, the second group blowout holes 32a-f, and the third group blowout holes 33a-z into the internal space of the container body 2.

Figure 9:
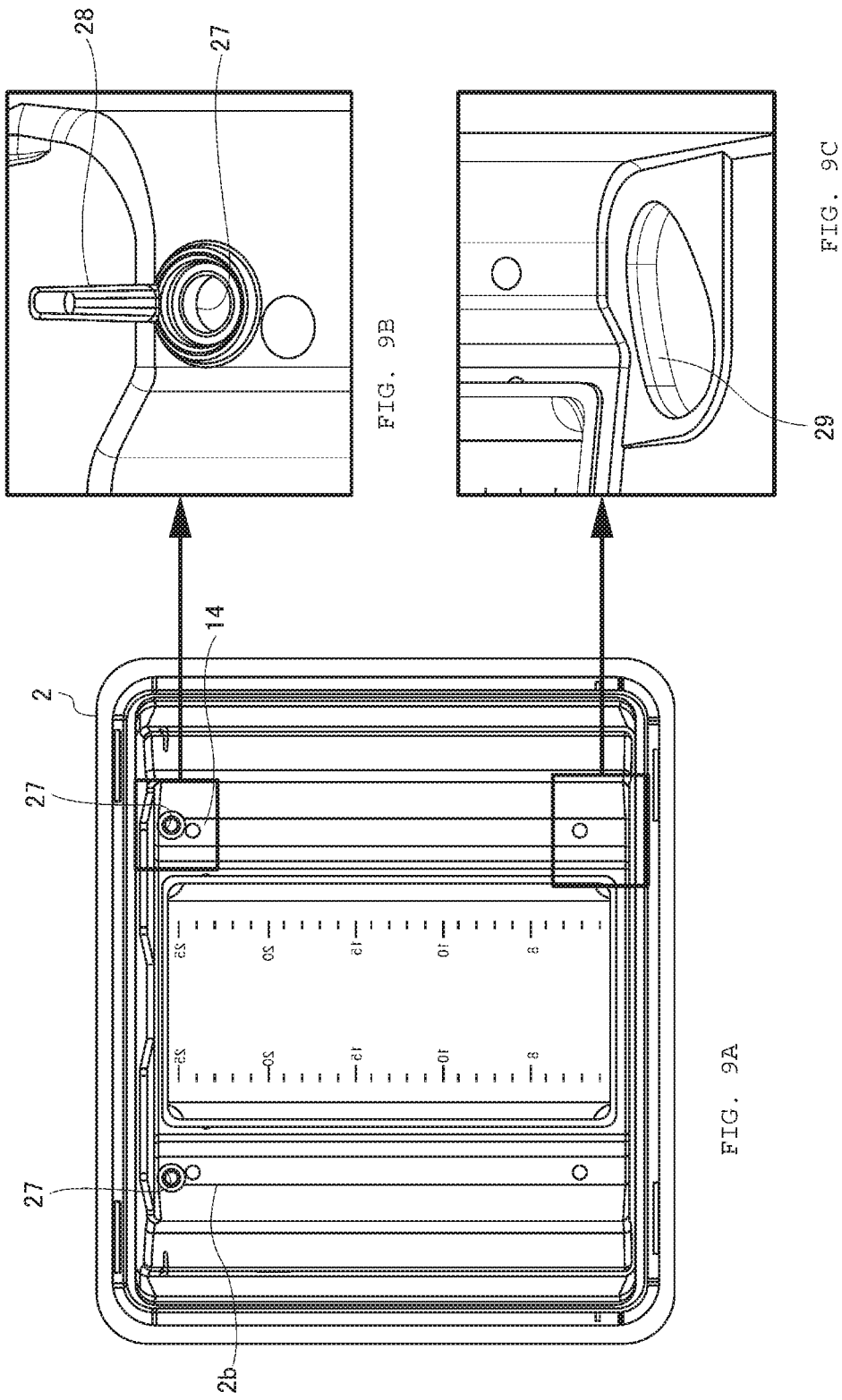
FIG. 9A is front schematic view of the container body.
FIG. 9B is an enlarged perspective view of an upper attachment portion of the gas replacement unit.
FIG. 9C is an enlarged perspective view of the lower attachment portion of the gas replacement unit.
Figure 10:
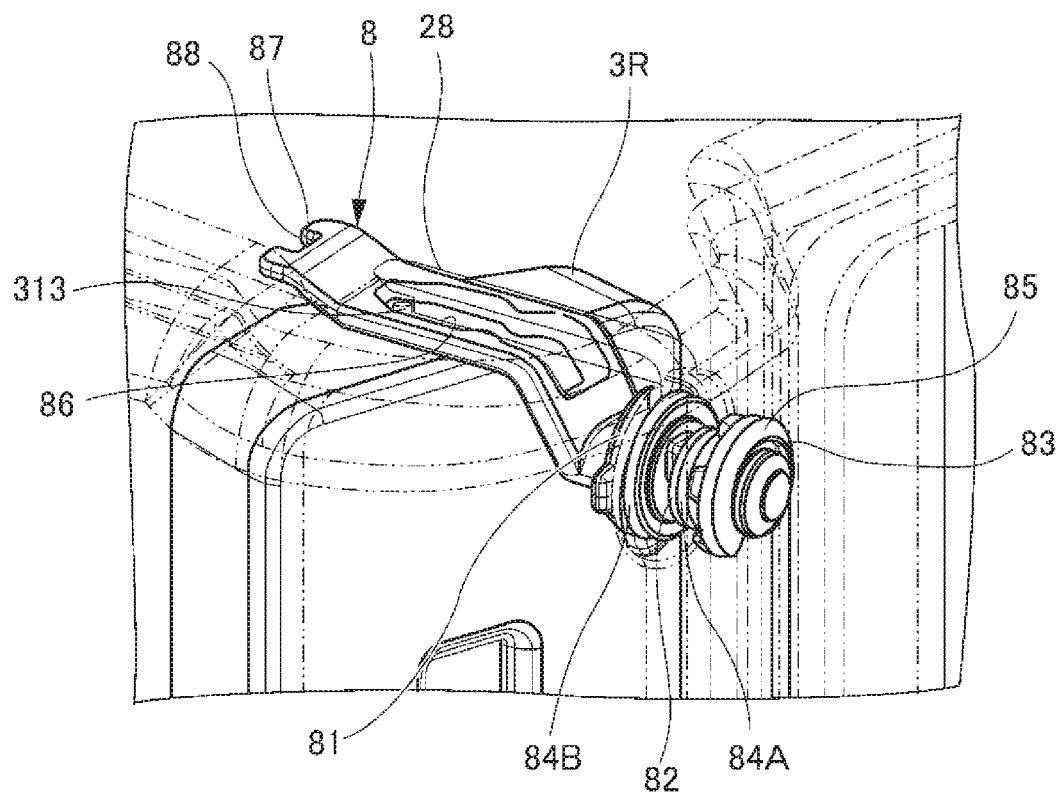
FIG. 10 is an enlarged perspective view of an upper attachment portion of the gas replacement unit.
Figure 11A:
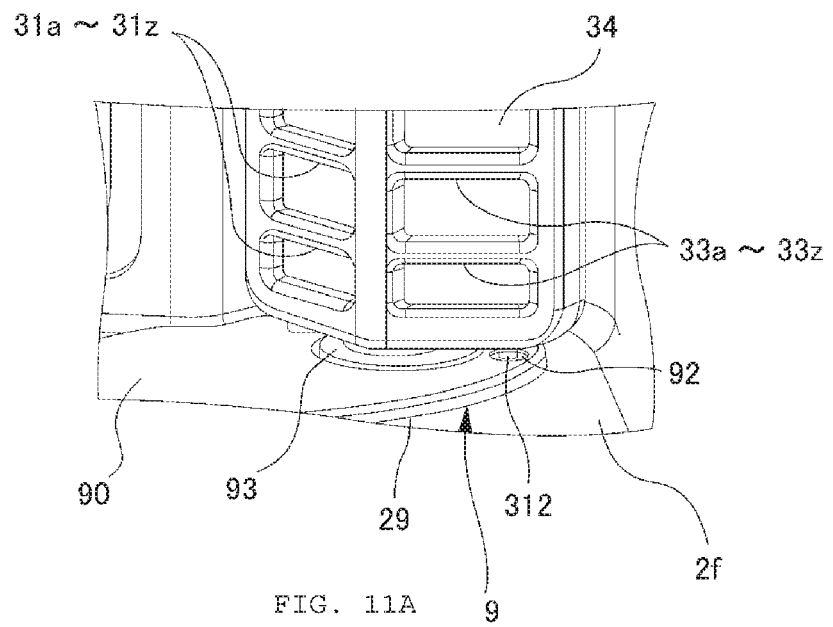
FIG. 11A is an enlarged view of a lower attachment portion of a gas replacement unit.
Figure 11B:
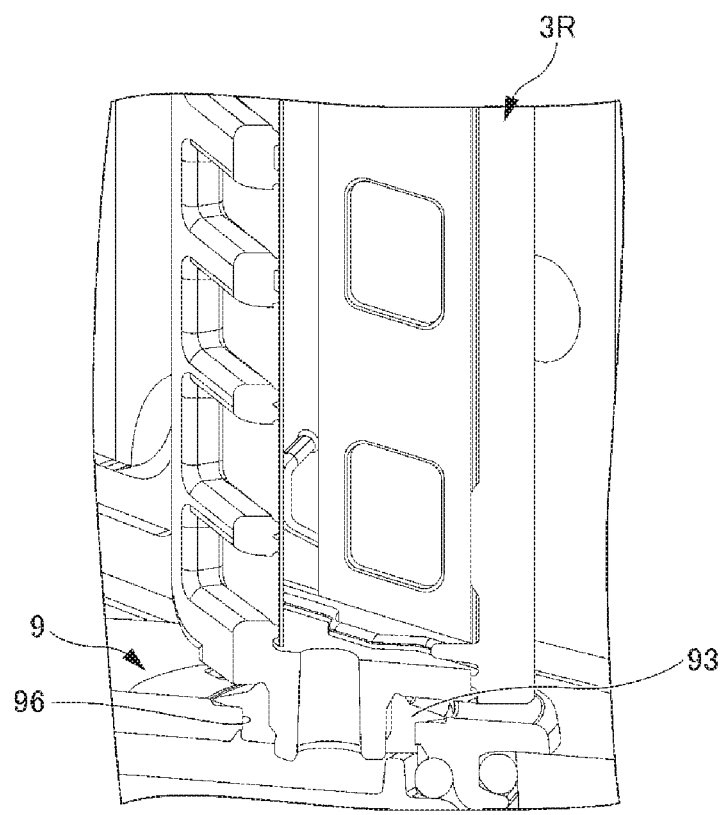
FIG. 11B is a cross-sectional perspective view.

A method of attaching the gas replacement unit 3R to the container body 2 will be described. FIG. 9A is a schematic front view of the container body 2, FIG. 9B is an enlarged perspective view of the upper attachment portion of the gas replacement unit, and FIG. 9C is an enlarged perspective view of the lower attachment portion of the gas replacement unit. FIG. 10 is an enlarged perspective view of an upper attachment portion of the gas replacement unit 3R. FIG. 11A is an enlarged view of a lower attachment portion of a gas replacement unit 3R, and FIG. 11B is a cross-sectional perspective view.

The gas replacement unit 3R is attached to the container body 2 by a position fixing member 8 and an offset member 9. Specifically, the upper portion of the gas replacement unit 3R is attached to the position fixing member 8, and the lower portion of the gas replacement unit 3R is attached to the offset member 9.

Therefore, circular through holes 27 are formed in the left and right sides of the rear wall 2b of the container body 2 in order to fix the position fixing member 8, and also a stopper 28 is formed above the through hole 27. On the other hand, attachment holes 29 are formed on the left and right sides of the bottom surface 2f of the container body 2 in order to fix the offset member 9. The attachment holes 29 are formed in a substantially elliptical shape instead of a circular shape by connecting a large circle and a small circle.

The position fixing member 8 shown in FIG. 10 has an elongated shape, one end side of which is formed in a substantially plate shape and the other end side thereof is formed by a rectangular shaft. Three disk-shaped flanges 81, 82, 83 are formed toward the other end side around this shaft. The shaft end flange 83 and the middle flange 82 are smaller than the diameter of the through hole 27 in the rear wall 2b and are inserted into the through hole 27. A small-diameter stepped portion is formed in the middle flange 82, and an O-ring 84A is fitted therein. A small-diameter stepped portion is also formed in the inner flange 81, and an O-ring 84B is fitted therein. The inner flange 81 and the O-ring 84B are formed larger than the diameter of the through hole 27, and when the other end side of the position fixing member 8 is inserted into the through hole 27, since the O-ring 84B is sandwiched between the container body 2 and the flange 81, the gas G does not leak out.

After inserting the position fixing member 8 into the through hole 27, a rectangular shaft is positioned between the shaft end flange 83 and the container body 2 with a C-ring 85 inserted in between and in which the inner surface of the C-ring forms a rectangular shape and its outer diameter is larger than the through hole 27; the position fixing member 8 is fixed to the container body 2 through the through hole 27. Specifically, sealing is enhanced by inserting the C-ring 85 while squashing the O-ring 84B between the flange 81 and the container body 2 and while pulling the shaft end flange 83 toward the outside.

Further, one end of the position fixing member 8 has a plate shape bent upward, and an elongated slit 86 is formed. The positioning protrusion 313 and the stopper 28 of the housing member 31 are fitted into the slit 86. The end 87 is further curved toward the top, and a U-shaped notch 88 is further formed at the tip thereof.

An offset member 9 shown in FIG. 11A and FIG. 11B is provided between the offset plate presser 90 positioned on the inside of the bottom surface 2f and the offset plate 95 positioned on the outside of the bottom surface 2f, and is assembled via an O-ring 94 so that a gap through which the gas G can flow is formed.

The offset plate presser 90 is formed with a recess 92 into which the rotation stopping protrusion 312 of the housing member 31 fits, and when the rotation stopping protrusion 312 fits into the recess 92, the direction and position of the rotating gas replacement unit 3R are fixed. A hole is formed in the offset plate presser 90 for inserting the connecting member 311 of the gas replacement unit 3R, and the connecting member 311 is inserted through a packing 93. In the attachment hole 29, the offset plate presser 90 is fitted via an O-ring 91.

A concave portion into which the intake valve 50 is fitted is formed in the offset plate 95 so that the center of the intake valve 50 is located at a position displaced from the center position of the packing 93 as seen in the plan view.

With such a configuration, in the gas replacement unit 3R, the lower connecting member 311 is first attached to the offset member 9, and thereafter, the upper positioning protrusion 313 is attached to the position fixing member 8 and attached to the container body 2.

More specifically, because the connecting member 311 at the lower portion of the gas replacement unit 3R is inserted into the packing 93 and inclined, by pushing the positioning protrusion 313 on the upper portion of the gas replacement unit 3R from the end 87 toward the slit 86, the position fixing member 8 curves, and the positioning protrusion 313 fits into the slit 86. At the same time, the positioning protrusion 313 also comes into contact with the stopper 28, so that its position in the slit 86 is fixed, and the upper portion of the gas replacement unit 3R is fixed in a position.

Finally, the flow of the gas G will be described. FIG. 12 is a cross-sectional perspective view showing the flow of the gas G flowing from the intake valve 50. The flow of the gas G is indicated by arrows. In FIG. 12, the gas G which is introduced at a high pressure from the intake valve 50 passes through the filter member 51, and flows through the gap between the offset plate presser 90 and the offset plate 95, and is directed to the connection portion between the offset plate presser 90 at the back B and the connecting member 311 at the lower portion of the gas replacement unit 3R.

Thereafter, the gas G is blown out from the first group blowout holes 31a-z, the third group blowout holes 33a-z and the second group blowout holes 32a-f while advancing into the storage space of the gas replacement unit 3R (see FIG. 8). At this time, the gas G is blown out in three different directions, i.e. in the direction toward the center of the front F, in the direction toward the right side wall 2c and in the direction toward the rear wall 2b at the back B (see FIG. 4).

Here, the direction of the gas G blown out from the first group blowout holes 31a-z toward the vicinity of the center on the front F side of the container body 2, and the direction of the gas G blown out from the third group blowout holes 33a-z toward the right side wall 2c or the left side wall 2d of the container body 2 will be specifically described.

The advancing direction of the blowout openings of the first group blowout holes 31a-z or the third group blowout holes 33a-z, i.e. the normal line passing through the center of the surface 31A or the surface 31B where the first group blowout holes 31a-z or the third group blowout holes 33a-z are formed does not intersect with the right side wall 2c or the left side wall 2d and is preferably in a range reaching the opening of the front opening frame 2a of the container body 2. More preferably, in the case of the gas replacement unit 3R, the normal line to the surface 31A is in the range of 10° to 40° with respect to the normal line NL (perpendicular) from the opening of the front opening frame 2a of the container body 2, and the normal line of the surface portion 31B is in the range of 5° from the center side to 10° on the right side wall 2c, with the normal line NL (perpendicular) from the opening of the front opening frame 2a of the container body 2 therebetween. In the case of the gas replacement unit 3L, it is symmetrical with the gas replacement unit 3R.

The surface 31A and the surface 31B (or the first group blowout holes 31a-z and the third group blowout holes 33a-z) are formed so as to be within such a range, and by arranging the gas replacement units 3R, 3L inside the container body 2, the gas G blown out from the respective blowout holes does not collide with the right side wall 2c or the left side wall 2d of the container body 2 to be reflected. Therefore, since turbulence does not occur in the gas flow of the gas G, it is possible to quickly and reliably replace the internal space of the container body 2 with the gas G.

When the lid 4 is attached to the container body 2, the gas G is supplied to the container body 2 at a high pressure, and when the interior space is filled, the gas G flows out of the container body 2 from the exhaust valve 60 shown in FIG. 3. Due to this outflow of air, the internal space of the substrate storage container 1 is replaced with the gas G which is a purge gas.

On the other hand, when the lid 4 is not attached, downflow air from an external device such as a clean room (not shown) flows in from the front F of the container body 2, but the internal space of the substrate storage container is replaced with the gas G which is a purge gas while resisting this air.

Figure 13A:
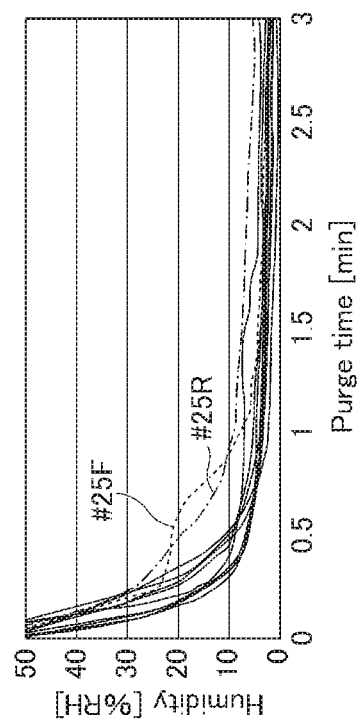
FIG. 13A shows comparative examples and FIG. 13B shows examples of execution showing experimental results of gas replacement.
Figure 13B:
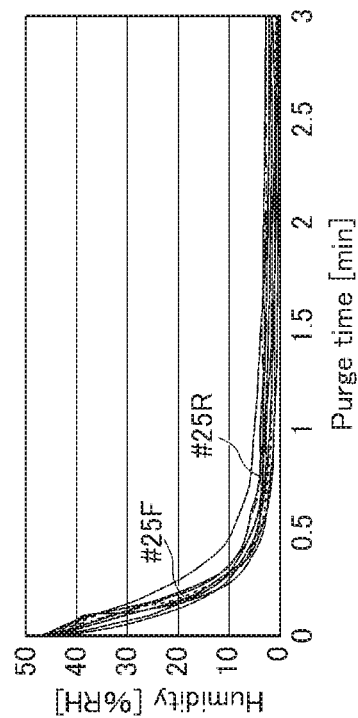

Hereinafter, specific experimental examples for confirming the present embodiment and the results thereof will be described with reference to FIGS. 13A and 13B. FIG. 13A shows comparative examples and FIG. 13B examples of execution showing experimental results of gas replacement.

Examples of Execution

The gas replacement units 3R, 3L were attached to the substrate storage container 1 where the opening area of the topmost first group blowout hole 31a is larger than the opening area of the first group blowout hole 31b, and where the opening area of the top third group blowout hole 33a is larger than the opening area of the third group blowout hole 33b (see FIGS. 7A-7D, and gas G was purged at a flow rate of 90 L/min (per unit); the change in the humidity in the substrate storage container 1 was measured near the apex on the front side (F position) and near the apex on the right side (R position) for each row of stored substrates W(#1 to #25). Note that the substrate storage container 1 was set up such that the downflow was 0.4 m/s when the lid 4 was removed. At this time, the differential pressure between the inside and the outside of the container body 2 was 1.7 Pa.

Comparative Example

In the comparative example, for the gas replacement units 3R and 3L shown in FIGS. 7A-7D, the opening area of the topmost first group blowout hole 31a was the same as the opening area of the first group blowout hole 31b, and the opening area of the topmost third group blowout hole 33a was made the same size as the opening area of the third group blowout hole 33b.

In the comparative example, the humidity value and transition state (replacement completion time) in the space above the substrates W of the uppermost row (positions #25F and #25R) were far apart from those results in the other rows, but in the example of execution, there was no variation in the humidity value or transition state in the space above the substrates W regardless of the row of the stored substrates W.

As described above, the substrate storage container according to the embodiment of the present invention comprises a container body 2 having an opening at the front and capable of containing a plurality of substrates W, a lid 4 for closing the opening, intake valves 50 for supplying gas G from outside of the container body 2 to the internal space, and gas replacement units 3R and 3L for blowing out the gas G supplied from the intake valve 50 into the internal space of the container body 2, wherein the intake valves 50 are attached to the back B of the bottom surface 2f of the container body 2, wherein the gas replacement units 3R, 3L each include a housing member 31 which stores the gas G supplied from the intake valve 50, and a cover member 32 which covers the opening of the housing member 31, wherein each housing member 31 has a plurality of first group blowout holes 31a, 31b, 31c . . . 31x, 31y, 31z in the vertical direction for blowing out the stored gas G in the front direction of the container body 2, and wherein the opening area of the uppermost first group blowout hole 31a is larger than the opening area of the first group blowout hole of the second row.

As a result, the gas G blown out from the first group blowout hole 31a of the gas replacement units 3R, 3L flows toward the front direction F in the space formed between the substrates W stored in the uppermost row and the inner surface of the top surface 2e of the container body 2. Therefore, even when the storage state of the substrates W changes, providing a substrate storage container 1 having smaller variations in humidity or concentration among the substrates W is possible.

In the embodiment, at least one of the first group blowout holes 31a-z is located below the lowermost row of stored substrates W in the container body 2. Therefore, even when the storage state of the substrates W changes, providing a substrate storage container 1 having smaller variations in humidity among the substrates W is possible.

In the present embodiment, the gas replacement units 3R, 3L include an air permeable filter member 34 inside the housing member 31. As a result, even if dust is present in the supplied gas G, because the dust is captured by the filter member 34 and does not blow into the container body 2, the internal space of the substrate storage container 1 does not become contaminated.

In the embodiment, at least one of the upper portion and the central portion of the housing member 31 is positioned and fixed by using the through holes 27 formed in the rear wall 2b of the container body 2. Thereby, since the gas replacement units 3R, 3L are attached using the position fixing member 8 that can be easily attached to and detached from the through holes 27, the gas replacement units 3R, 3L can be easily attached or detached from the container main body 2. Even when cleaning the container body 2, the gas replacement units 3R, 3L can easily be removed and every corner of the interior of the container body 2 can be cleaned. In addition, the removed gas replacement units 3R, 3L can easily be cleaned.

In the embodiment, the gas G is nitrogen gas or dry air. As a result, since the internal space of the substrate storage container 1 is kept inactive or has low humidity, the surfaces of the substrates W do not become degenerated.

(Modifications)

In the gas replacement units 3R, 3L of the embodiment, the opening area, number, and arrangement of the first group blowout holes 31a-z, the third group blowout holes 33a-z, and the second group blowout holes 32a-f are not limited to the embodiment, and the amount of blown air blown downward may be increased so that it can oppose the air from the outside such as the downflow air blown along the upper surface of the bottom surface 2f.

Further, by selectively blocking or drilling the second group blowout holes 32a-f, the ratio of the blown air volume to the front F and the back B is able to be adjusted. Moreover, by changing the position of the recess of the offset member 9, the direction of the gas replacement units 3R, 3L may be changed. Alternatively, the intersection angle of the two surfaces 31A, 31B of the housing member 31 may be changed, or the area may be changed to adjust the blowout direction and/or the ratio of the blowout airflow rate. These changes can be dealt with by using inserts in the molding die.

In addition, the housing member 31 may be positioned and fixed not at the upper portion but at the central portion, or may be positioned and fixed at the upper portion and the central portion. At this time, the position of the through hole 27 formed in the rear wall 2b may be appropriately changed, and the shape of the position fixing member 8 may be appropriately changed. Furthermore, the housing member 31 is not limited to one that is positioned and fixed to the container body 2, but instead the cover member 32 constituting the gas replacement units 3R, 3L may be positioned and fixed to the container body 2.

In the above embodiment, in addition to the gas replacement units 3R and 3L, a plurality of other gas replacement units may be provided, or alternatively, any one of the gas replacement units 3R and 3L may be used. For example, even if one gas replacement unit is provided in a region that does not interfere with the substrates W in the central portion of the back B, the opening area of the first group blowout hole 31a in the uppermost row may be larger than the opening area of the first group blowout hole 31b in the second row.

In addition, the gas replacement units 3R, 3L are not limited to the two positions on the left and right sides at the back B, and may be arranged in the region of the center of the back B if there is a region in that area that does not interfere with the substrates W.

Although the preferred embodiments of the present invention have been described in detail above, the present invention is not limited to the above-described embodiments, and various modifications and changes are possible within the scope of the gist of the present invention described in the claims.

DESCRIPTION OF THE REFERENCES

1 Substrate Storage Container
2 Container Body
2a Front Opening Frame
2b Rear Wall
2c Right Side Wall
2d Left Side Wall
2e Top Surface
2f Bottom Surface
21 Support Piece(s)
21b Auxiliary Support Piece(s)
22 Position Regulating Portions
23 Grip
25 Top Flange
26 Bottom Plate
27 Through Hole(s)
28 Stopper(s)
29 Attachment Hole(s)
3L,3R Gas Replacement Unit(s)
31 Housing Member
31A,31B Surface(s)
311 Connecting Member
312 Rotation Stopping Protrusion(s)
313 Positioning Protrusion(s)
32 Cover Member
31a . . . z First Group Blowout Hole(s)
32a . . . f Second Group Blowout Hole(s)
33a . . . z Third Group Blowout Hole(s)
34,35 Filter Member(s)
4 Lid
50 Intake Valve(s)
50a Grommet
51 Filter Member
52 Check Valve
53 Coil Spring
54 Valve Housing
60 Exhaust Valve
8 Position Fixing Member
81, 82, 83 Flange(s)
84A,84B O-Ring(s)
85 C-Ring
86 Slit
87 End
88 Notch
9 Offset Member
90 Offset Plate Presser
91 O-Ring
92 Recess
93 Packing
94 O-Ring
95 Offset Plate
F Front
B Back
G Gas
W Substrate(s)
NL Normal Line

The invention claimed is:

1. A substrate storage container comprising:
a container body having an opening at a front and capable of containing a plurality of substrates,
a lid for closing the opening,
at least one intake valve for supplying gas from outside of the container body to an internal space of the container body, and
at least one gas replacement unit which blows the gas supplied from the at least one intake valve into the internal space of the container body,
wherein the at least one intake valve is attached to a rear of a bottom of the container body,
wherein the at least one gas replacement unit comprises a housing member which stores the gas supplied from the at least one intake valve, and a cover member which covers an opening of the housing member,
wherein the housing member has a plurality of first group blowout holes provided in a vertical direction and configured to substantially direct the stored gas toward a front center of the container body, and
wherein, in the plurality of first group blowout holes, an opening area of an uppermost blowout hole is larger than an opening area of a secondary uppermost blowout hole adjacent to the uppermost blowout hole in the vertical direction.

2. The substrate storage container according to claim 1, wherein at least one of the plurality of first group blowout holes is positioned lower than a lowermost level of the substrates stored in the container body.

3. The substrate storage container according to claim 1, wherein the at least one gas replacement unit includes an air permeable filter member inside the housing member.

4. The substrate storage container according to claim 1, wherein at least one of an upper portion or a central portion of the at least one gas replacement unit is positioned and fixed using a through hole formed in a back wall of the container body.

5. The substrate storage container according to claim 1, wherein the gas is nitrogen gas or dry air.

6. A gas replacement unit for a substrate storage container having a container body having an opening on a front and capable of containing a plurality of substrates, a lid for closing the opening, and at least one intake valve for supplying gas from the outside of the container body to an internal space of the container body with the at least one intake valve attached at a rear of a bottom surface of the container body, the gas replacement unit comprising:
 a housing member which stores the gas supplied from the at least one intake valve, and
 a cover member which covers an opening of the housing member,
 wherein the housing member has a plurality of first group blowout holes provided in a vertical direction and configured to substantially direct the stored gas toward a front center of the container body, and
 wherein, in the plurality of first group blowout holes, an opening area of an uppermost blowout hole is larger than an opening area of a secondary uppermost blowout hole adjacent to the uppermost blowout hole in the vertical direction.

7. The substrate storage container according to claim 1, wherein the housing member has a first surface and a second surface that intersect at a predetermined angle,
 wherein the plurality of first group blowout holes are formed in the first surface,
 wherein a plurality of third blowout holes configured to direct the gas toward the front along a side wall of the container body are formed in the second surface in the vertical direction, and
 wherein, in the plurality of third blowout holes, an opening area of an uppermost blowout hole is larger than a secondary uppermost blowout hole.

8. The substrate storage container according to claim 7, wherein a total opening area of the plurality of the first blowout holes is larger than a total opening area of the plurality of the third blowout holes.

9. The substrate storage container according to claim 7, wherein the plurality of third group blowout holes comprise at least one lower blowout hole located on a lower side and a plurality of intermediate blowout holes located between the uppermost blowout hole and the at least one lower blowout hole, the at least one lower blowout hole having an opening area larger than each of opening areas of the plurality of intermediate blowout holes.

10. The substrate storage container according to claim 7, wherein the cover member comprises a plurality of second blowout holes provided in the vertical direction and configured to direct the gas toward a rear of the container body.

11. The substrate storage container according to claim 10, wherein a total opening area of the plurality of the first blowout holes and a total opening area of the plurality of the third blowout holes both are larger than a total opening area of the plurality of the second blowout holes.

12. The gas replacement unit according to claim 6, wherein the plurality of first group blowout holes comprise at least one lower blowout hole located on a lower side and a plurality of intermediate blowout holes located between the uppermost blowout hole and the at least one lower blowout hole, the at least one lower blowout hole having an opening area larger than each of opening areas of the plurality of intermediate blowout holes.

13. The substrate storage container according to claim 1, wherein the plurality of first group blowout holes comprise at least one lower blowout hole located on a lower side and a plurality of intermediate blowout holes located between the uppermost blowout hole and the at least one lower blowout hole, the at least one lower blowout hole having an opening area larger than each of opening areas of the plurality of intermediate blowout holes.

\* \* \* \* \*